(12) United States Patent
Oeschay et al.

(10) Patent No.: US 7,383,416 B2
(45) Date of Patent: Jun. 3, 2008

(54) METHOD FOR SETTING A SECOND RANK ADDRESS FROM A FIRST RANK ADDRESS IN A MEMORY MODULE

(75) Inventors: Peter Oeschay, Wehringen (DE); Hermann Ruckerbauer, Moos (DE)

(73) Assignee: Infineon Technologies AG, Neubiberg (DE)

( * ) Notice: Subject to any disclaimer, the term of this patent is extended or adjusted under 35 U.S.C. 154(b) by 287 days.

(21) Appl. No.: 11/130,412

(22) Filed: May 17, 2005

(65) Prior Publication Data

US 2006/0265543 A1 Nov. 23, 2006

(51) Int. Cl.
*G06F 12/00* (2006.01)

(52) U.S. Cl. .................. 711/211; 711/217; 711/170; 711/5; 711/2; 365/230.01; 365/230.03; 713/1

(58) Field of Classification Search .............. 711/5, 711/2, 211, 214, 216, 217, 218, 170; 365/230.01, 365/230.03; 713/1
See application file for complete search history.

(56) References Cited

U.S. PATENT DOCUMENTS

| | | | | |
|---|---|---|---|---|
| 6,366,989 B1 * | 4/2002 | Keskar et al. | ............... | 711/167 |
| 7,286,436 B2 * | 10/2007 | Bhakta et al. | ......... | 365/230.02 |
| 7,289,386 B2 * | 10/2007 | Bhakta et al. | ......... | 365/230.06 |
| 2005/0044302 A1 * | 2/2005 | Pauley et al. | .................. | 711/1 |
| 2005/0138267 A1 * | 6/2005 | Bains et al. | ................ | 711/100 |
| 2006/0004981 A1 * | 1/2006 | Bains | ........................ | 711/202 |
| 2006/0062047 A1 * | 3/2006 | Bhakta et al. | ......... | 365/185.09 |
| 2006/0129712 A1 * | 6/2006 | Raghuram | ................... | 710/52 |
| 2006/0129755 A1 * | 6/2006 | Raghuram | ................... | 711/105 |
| 2006/0129899 A1 * | 6/2006 | Cochran et al. | ............ | 714/718 |

\* cited by examiner

*Primary Examiner*—Hong Kim
(74) *Attorney, Agent, or Firm*—Edell, Shapiro & Finnan, LLC

(57) ABSTRACT

A method for setting an address of a rank in a memory module having a number of memory chips distributed along a byte lane includes setting the first memory chip of the byte lane to have a first rank address, generating a second rank address therein from the first rank address, and driving the second rank address to a second one of the memory chips. Alternatively, the first rank address may be driven to the second memory chip, and then, a second rank address is generated in that second memory chip. Further, the second memory chip is set to have the second rank address in response to the driving the second/first rank address. A power-up sequence after voltage supply, or command signals sent via a serial management bus or the command address bus can be used to initiate the setting of ranks. The rank addresses are re-driven to adjacent memory chips by DQ-lines along a byte lane.

38 Claims, 4 Drawing Sheets

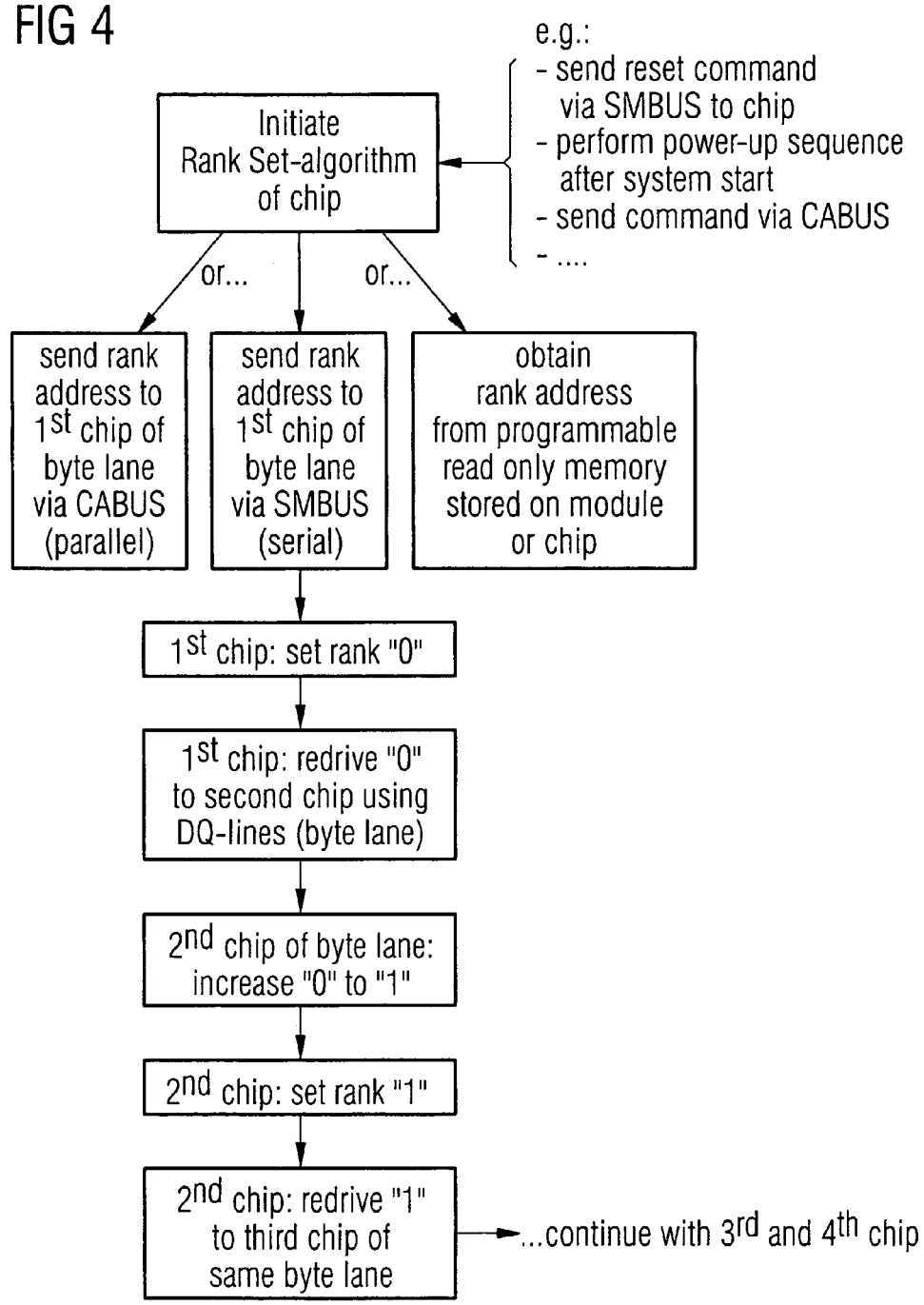

METHOD FOR SETTING A SECOND RANK ADDRESS FROM A FIRST RANK ADDRESS IN A MEMORY MODULE

FIELD OF THE INVENTION

The invention relates to semiconductor memory modules, and more particularly, to a method for setting an address of a rank in a semiconductor memory module and configuring ranks of a semiconductor memory module.

BACKGROUND

A memory module of a computing device, such as a PC or workstation, is commonly arranged in terms of ranks. A rank comprises that number of memory chips, which, in sum, provide that number of data lines which corresponds to the width of a bus used to store data in the memory module by, e.g., a controller or a chip set. Typically, the bus width amounts to 64 bits. A rank thus defines a 64 bit wide area in memory. Including an error correction code (ECC), a rank defines a 72 bit wide area.

There are memory chips, which are accessible by four ("×4") or eight ("×8") data lines for retrieving data stored in a respective memory array. Correspondingly, a rank comprises 16×4-chips or 8×8-chips (including the ECC: 18×4-chips or 9×8-chips). A double-sided memory module may then, e.g., comprise 1, 2, or 4 ranks.

In order to write to or read data from a memory module, each rank has a known unique rank address. There are at least two possibilities depending on the kind of connection between the controller or the chip set, and each of the memory chips.

According to a first implementation the controller has additional lines, which afford a connection to each of the memory ranks in parallel. A further chip select signal is necessary to address the respective chips of a desired rank. In this case, which is represented by semiconductor memory modules of type DDR1-DDR3 (DDR: double data rate), further pins are needed with respect to the connector of the memory module, which represents a disadvantage in view of space saving and current reduction.

According to a second implementation, each memory chip (package) is provided with, e.g., two additional balls of a ball grid array (BGA). Both additional balls, which are then hardwired on a DIMM (double inline memory module) together define a rank address, which the chip belongs to, e.g., one of the four rank numbers 0-3. Thus, when a write command is issued, it is driven along with a transferal of the corresponding rank address (0-3). However, recent efforts trying to reduce the number of balls on a chip package in order to reduce footprint and increase the storage density are disadvantageously counteracted by that solution.

To reduce the amount of wiring and/or number of balls or pins needed to address memory chips of a memory module with respect to a memory controller or a chip set, and to increase storage density and readout velocity of semiconductor memory modules are desirable.

SUMMARY

A method for setting an address of a rank in a memory module includes setting a first one of the memory chips to have a first rank address, generating a second rank address from the first rank address in the first memory chip, driving the second rank address to a second one of the memory chips, and setting the second memory chip to have the second rank address in response to driving the second rank address due to the first memory chip. The memory module is controlled by a memory controller or a chip set, and includes a number of memory chips.

Further, a method for setting an address of a rank in a memory module includes setting a first one of the memory chips to have a first rank address, driving the first rank address to a second one of the memory chips, generating a second rank address from the first rank address in the second memory chip, and setting the second memory chip to have the second rank address in response to driving the second rank address due to the first memory chip. The memory module is controlled by a memory controller or chip set, and includes a number of memory chips.

A semiconductor memory system includes a memory controller and at least one memory module having a number of memory chips arranged in terms of ranks. At least one of the memory chips arranged to set the at least one memory chip to an initial first rank address, and drive the initial first rank address to a second memory chip.

Alternatively, the at least one of the memory chips is arranged to set at least one memory chip to an initial first rank address, generate the second rank address therefrom, and drive the second rank address to a second memory chip.

Memory chips of semiconductor memory modules are associated with rank addresses. Instead of achieving a rank configuration by hardwiring with additional pins or balls as in the prior art (parallel connection to the controller with a specific chip select signal, or additional balls in conjunction with a rank address associated with a write/read command), the memory chips are configured with a rank address in a low speed mode via existing wires. One of a command address bus (CA), a data line bus (DQ), or a serial management bus (SMBUS), which configure memory chips, is employed for rank configuration in that mode. However, the invention is not limited to using those bus systems.

Preferably, the configuration phase, when initialization of the memory chips after a system start is performed in order to set timing parameters, sizes, etc., is used to perform the method of the invention. This phase has a low speed of data transmission since the degree of synchronism of signals on parallel lines of a bus is small. However, when according to an embodiment of the invention the command address is used to initiate the rank setting, high speed communication mode is not ruled out.

A number of memory chips may be arranged along a byte lane on a memory module. If there are to be arranged four ranks per memory module, a byte lane, which defines a channel, connects each four memory chips of different rank in a sequential manner with the memory controller, or the chips set. The byte lane includes, e.g., four or eight data lines of a data line bus.

According to the invention, the byte lane is used to drive a rank address from one memory chip to the next one, thereby each generating another rank address from a previous one. In a simple case, an initial rank address is incremented by "1". Then, in case the initial address is "0" for a first memory chip along a byte lane, a next one in the sequence receives a "1" as a rank address.

The generation of a new rank address from a previous one, e.g., the increment, or addition, by "1" can be performed by either the transmitting memory chip or the receiving memory chip in each case. Both embodiments are covered by the invention. If there are four ranks to be configured and four memory chips arranged along a byte lane, the last memory chip receives a "3" according to the example provided above.

In order to communicate along a byte lane, the transmit ports and receive ports with respect to the data lines of each memory chip are used. In performing a rank configuration, e.g., a rank address of one memory chip is provided to its transmit port and then sent to a neighboring memory chip, which is arranged adjacent to the previous one.

The neighboring memory chip receives the rank address at its receive port and afterwards performs an incremental operation on this rank address number by a "1".

Depending on the configuration algorithm, this memory chip either stores the increased address or stores the still not increased rank address into an address buffer associated with the chip. For example, in one case a rank address is first forwarded, then increased and set as a new rank address to that receiving chip, and in another case, a rank address is first increased, and then driven to the next chip to be set as that chip's rank address.

The design of sequentially along a byte lane arranged chips having transmit and receive ports is particularly suited with respect to future high speed memory interfaces, such as the forthcoming DDR-4 standard.

An issue of the invention relates to an initial rank address to be set with respect to a respective first memory chip along the byte lane, which deviates from the rank setting of the second and any further chip along that lane. In a first aspect, a command signal may be sent by the memory controller, or the chip set, in order to initiate the rank set configuration.

In a second aspect, each set of memory chips arranged along a byte lane starts its own rank set configuration after a power-up sequence has been performed in the module, i.e., after system startup of voltage and power supply. According to this aspect, the first memory chip performs the rank set steps in response to the power-up sequence, and the other chips are driven thereafter one by one as a consequence of a forwarded and repeatedly increased rank address.

There are several embodiments according to the first aspect of how the command signal can be communicated from the controller, or the chip set, to this first memory chip. According to one embodiment the common command address bus is used. In one case (new memory technology), a rank is defined by 32 data lines, a corresponding command address bus comprises 24 lines with each of the, e.g., ×8-memory chip being arranged along one of 4 byte lanes. In that case, 8 data lines connecting the chip are accompanied each by 6 command address lines.

These 6 lines, or a subset therefrom, may be used to send a command signal from the controller the first memory chip. According to the invention, the memory chip is associated with a protocol based algorithm that provides for an interpretation of the incoming command signal in terms of carrying out the method as described above, i.e., setting a rank address from a currently received address, generating a next rank address from the current address, and forwarding it to an adjacent receive port of the next memory chip.

The first memory chip deviates from the other chips within the same lane in that it has an initial rank address, which is not communicated from a previous chip in the lane.

In summary, this first rank address
a) may thus be transmitted to the first chip by the command address bus (or any other bus), or
b) it is previously stored, e.g., in an EEPROM of the memory module, which is hardwired to the first chip, and is then just initiated by a single command signal,
c) or there is no command signal, and the rank address is hardwired to the chip (e.g., stored in EEPROM) and is obtained after performance of a power-up sequence of the chips on a module independently of a controller or a chip set.

According to a further embodiment of the invention, a serial management bus (SMBUS) is employed to transmit the command signal to the memory chip. This bus has one data line and an associated clock line. Using the SMBUS a series of instructions or simply just one single signal level can be transmitted to the memory chip. While the former series of instructions may sequentially be carried out in order to perform the steps of the invention, the latter embodiment of setting just one signal level, or simply a RESET command includes storing the instructions to carry out the protocol based algorithm within the regime of the memory chip, e.g., also in an EEPROM of the memory module, or on the chip itself.

The invention will become more clear with reference to specific embodiments when being taken in conjunction with the drawings.

BRIEF DESCRIPTION OF THE DRAWINGS

FIG. 4 shows in a flow chart an overview of some possible embodiments of the method according to the present invention.

DETAILED DESCRIPTION

Figure 1:
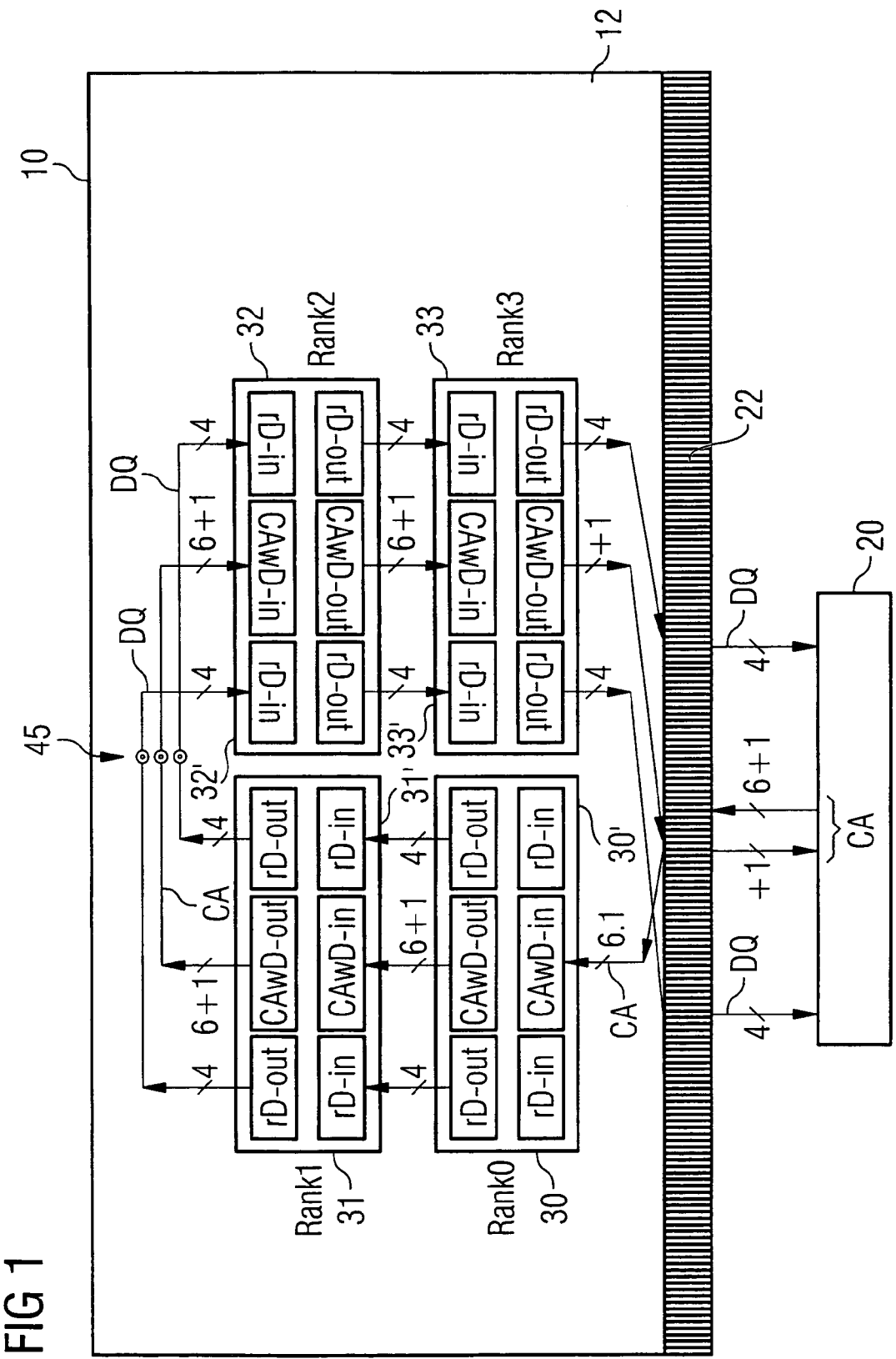
FIG. 1 shows a first embodiment according to the invention with a rank configuration by a command address bus and byte lane data lines.

FIG. 1 shows a first embodiment of the present invention. In the figures, busses include one or more lines are denoted with an obliged bar. Numbers denote the width of a respective bus, i.e., the number of lines associated with the bus per memory chip. The chips employed in this embodiment are ×4-DRAM chips (DRAM: dynamic random access memory).

The memory module 10 includes four ranks (Rank0 . . . Rank3) with each 16×4-memory chips, of which for simplicity eight×4-chips 30 are indicated in FIG. 1. The module 10 shown in FIG. 1 is a DIMM module with memory chips 30, 30', 31, 31' attached to the front side of a printed wiring board (PWB) 12, and with memory chips 32, 32', 33, 33' attached to the back side of the printed wiring board 12. Each two×4-memory chips, e.g., those with reference signs 30 and 30', provide a full bandwidth of 8 bit, and thus define a lower nibble and an upper nibble, respectively. A memory controller 20 communicates with memory module 10. The shaded area on the bottom side of the PWB 12 indicates the presence of pins 22 not shown in detail here.

Each of the pair of memory chips to be associated with the ranks (Rank0 . . . Rank3) includes a receive port CawD-in for the 6 lines of a command address bus CA and further receive ports rD-in for either side (left or right) of the module 10 with respect to the data lines (DQ-bus). Further, each pair of memory chips comprises a transmit port CawD-out for the 6 lines of a command address bus CA and further transmit ports rD-out for either side (left or right) of the module 10 with respect to the DQ-bus.

With such a configuration, a re-drive of CA or DQ-signals from each one memory chip to a next memory chip along a command address bus or byte lane of a channel is possible.

In carrying out a rank configuration according to this embodiment, the controller 20 first sends a command "SetRank" to each byte lane of the module 10. The byte lane according to FIG. 1 includes four pairs of memory chips, of which two chips are placed on opposite sides of the PWB 12. The chips are connected sequentially by the same byte lane DQ through via holes 45.

A "SetRank"-command may be sent via one of the CA-busses associated with a byte lane. More particularly, with a byte lane of that channel, and is thus received by a first one of those memory chips distributed along a corresponding byte lane DQ. More preferably, the "SetRank"-command is initiated via the SMBUS (see next embodiment) or is implicitly issued by a reset and/or performing a power-up sequence of the chips attached to the memory module. The "SetRank"-command sets the first chip of the byte lane into a rank configuration mode.

In this embodiment, a further rank address signal is sent from the controller via the CA-bus, which includes a rank address "0", which is received at the CawD-in port of the respective first DRAM-chip. As a consequence, this chip then sets its own rank to "0" and re-drives the issued command signal to a next memory chip of the same byte lane, i.e., on the DQ-bus. However, prior to submitting the address, the address "0" is increased by "1" to give a "1" as a new rank address, which indicated by "+1" in FIG. 1.

The next DRAM-chip receives the command at its receive port rD-in on the DQ-bus, sets its own address to "1", increases the address by "1" to give "2" and forwards (re-drives) the rank address to the third DRAM-chip. Continuing this scheme, the third DRAM-chip obtains a rank address "2" and the fourth memory chip obtains the rank address "3".

A second module (not shown in FIG. 1) may be treated by issuing a further "SetRank"-command, which leads to transmitting a rank address "4". Accordingly, memory chips of that module receive rank addresses "4" through "7", etc.

Figure 2:
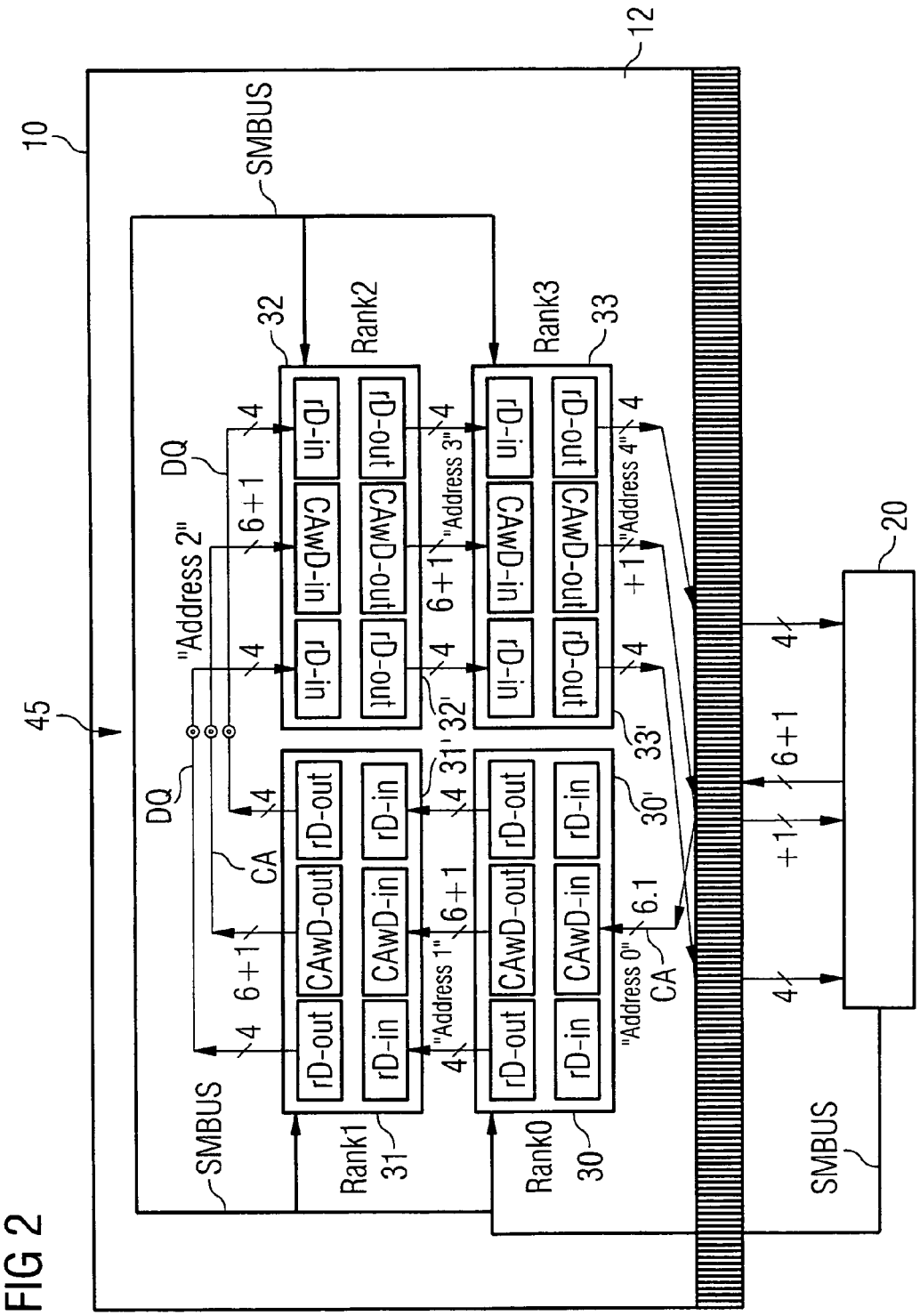
FIG. 2 shows a second embodiment according to the invention with a rank configuration by a serial management bus and byte lane data lines.

A second embodiment is shown in FIG. 2. As opposed to the previous embodiment, a serial management bus SMBUS is used to issue the "SetRank" command signal. However, any other low speed serial configuration bus is equivalently suitable for this purpose. This "SetRank"-command initiates each of the DRAM-chips in parallel to check the signal level on the respective lines of the CA- or DQ-bus.

In a next step, the current signal level is frozen and set as a preliminary rank address for each of the memory chips along the byte lane DQ. Next, the first DRAM-chip adds a "1" to its rank address and re-drives the address to the next DRAM-chip positioned adjacent on the byte lane DQ. This DRAM-chip receives the incremented rank address, overwrites its preliminary value with the new rank address and once more increments the rank address in order to forward it to the third DRAM-chip etc.

In this configuration mode a time is specified after which the controller assumes that the sequence of re-drives has successfully ended at the last DRAM-chip along a byte lane. If this is the case, the controller makes the rank addresses final and thus sends a further "finalizeRankSet"-command, which eventually freezes the rank addresses.

In an alternative embodiment, the last DRAM-chip sends back an information to the controller, e.g., an incremented rank address along the byte lane DQ. The controller then responds to this signal by, e.g., a further "finalizeRankSet"-command, which terminates the rank configuration by freezing the rank addresses.

Figure 3:
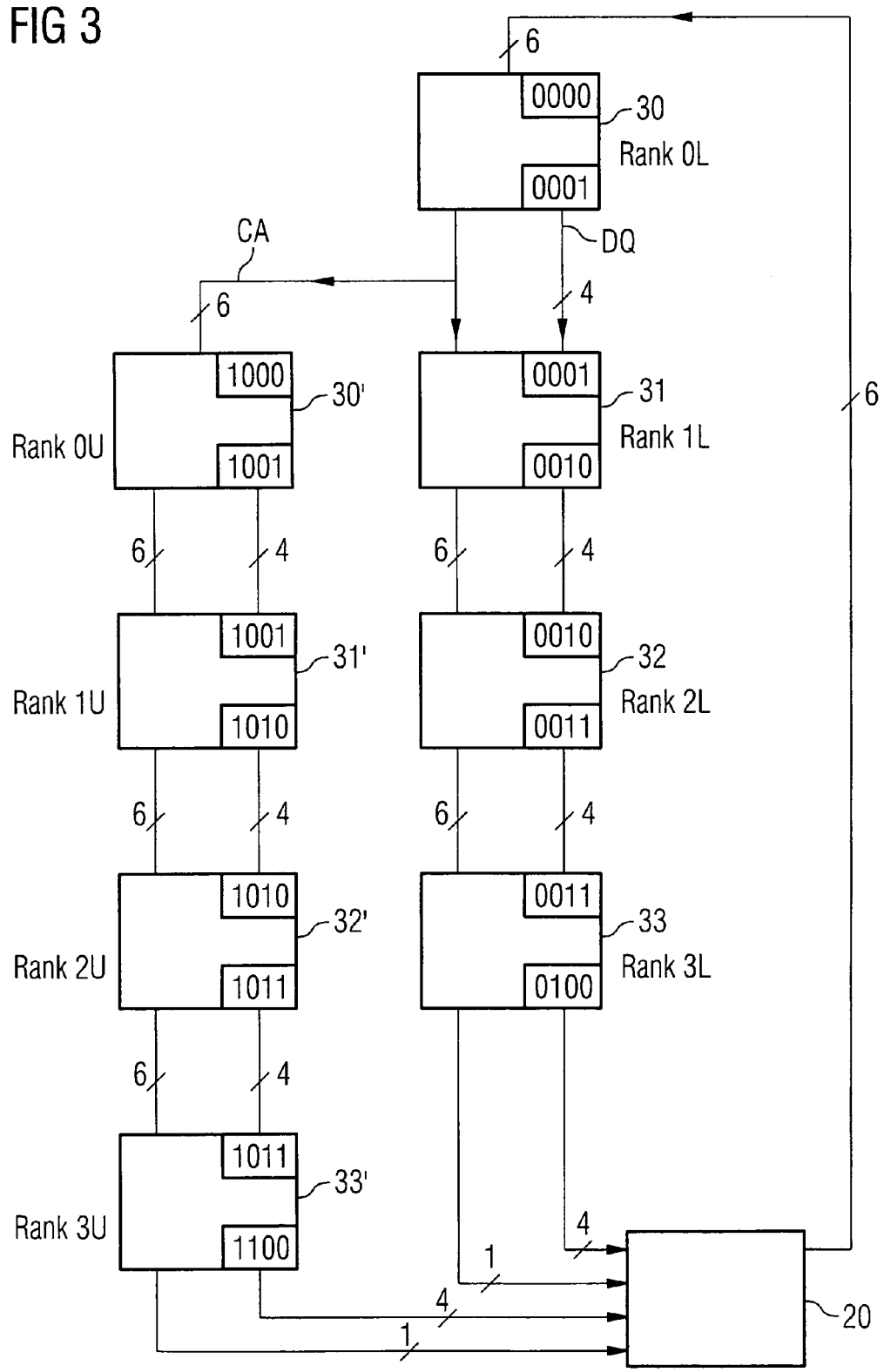
FIG. 3 shows a third embodiment according to the invention with a rank configuration by a command address bus and byte lane data lines, wherein nibbles of a rank are treated separately.

A third embodiment, which is similar to the previous embodiment is illustrated in FIG. 3. According to this embodiment, different nibbles ("upper" or "lower"), of a module 10 are treated separately. After giving initial power to a DRAM, or alternatively issuing a reset command or a serial management bus init command by the controller, the DRAM-chips are in a rank definition mode.

Initially, each of the DRAM-chips has a "1111" on its transmit port rD-out and checks the signal level on the corresponding receive port rD-in. Internally, a "1" is added to this input value.

The lower nibble DRAM-chips receive their rank address as follows: the first memory chip has a fixed "0000" at its receive port, because it is programmed on the DIMM module 10. It thus automatically attains a rank address "0 L". Further, the first memory chip switches its transmit port rD-out value from "1111" to "0001". Thus, the first memory chip along a byte lane having rank address "0 L" adds a binary "1" to the input DC signal and re-drives this new address value to the next DRAM-chip.

Up to this moment, the second DRAM-chip of the lower nibble had an undefined rank address, which in this case is "1111". The second DRAM-chip now receives a "0001" at its receive port, and is thus subsequently set to have a rank address "1 L" and switches its transmit port rD-out address value from "1111" to "0010" after having added a binary "1" to the address value.

"0010" is then put on the transmit port rD-out of this second DRAM-chip and received by the third DRAM-chip, which again adds a "1" and re-drives a "0011" to the fourth DRAM chip. The third chip is thus of rank address "2 L". The fourth memory chip equivalently adds a "1" to obtain and transmit a "0100" to the memory controller.

The upper nibble has a first memory chip with a fixed "1000" at its receive port rD-in. Accordingly, the upper nibble gets rank address "0 U" and switches the transmit port rD-out from "1111" to "1001". In an analogous sequence when compared with the lower nibble, the second DRAM-chip receives a rank address "1 U" due to a "1001" received at its receive port rD-in, the third chips has a "1010" with address "2 U" and the fourth chip has a "1011" with rank address "3 U". The controller receives back a "1100" on the DQ line.

After the controller 20 received back both signals "0100" and "1100", it releases a "SetRank"-command on the serial management bus (not shown in FIG. 3, see, however, FIG. 2), which fixes the rank and nibble addresses with respect to each DIMM module 10.

Using the method according to this embodiment, up to 8 ranks can be configured, when the upper nibble re-drives a "1111" to the controller. The signal re-driven on the CA-bus is not of further interest here, and, e.g., contains a "0" in case of ×4-chips and a "1" in case of ×8-chips.

An overview of some of the embodiments provided above is illustrated in the flow chart of FIG. 4, wherein it is noted that the invention is not limited to the detailed features as embodied in FIG. 4.

While the invention has been described in detail and with reference to specific embodiments thereof, it will be apparent to one skilled in the art that various changes and modifications can be made therein without departing from the spirit and scope thereof. Accordingly, it is intended that the present invention covers the modifications and variations of this invention provided they come within the scope of the appended claims and their equivalents.

What is claimed is:

1. A method for setting an address of a rank in a memory module, the memory module being controlled by a memory controller, or a chip set, the memory module including a number of memory chips, the method comprising:
   setting a first one of the memory chips to have a first rank address;
   generating a second rank address from the first rank address in the first memory chip;
   driving the second rank address to a second one of the memory chips; and
   setting the second memory chip to have the second rank address in response to driving the second rank address due to the first memory chip,
   wherein a power-up sequence of the memory module and each of the memory chips is performed after a system start or restart, the first memory chip being arranged:
   (a) to set the initial first rank address;
   (b) to generate the second rank address therefrom; and
   (c) to drive the second rank address to the second memory chip
   in response to the power-up sequence, wherein steps (a)-(c) are based on a protocol based algorithm stored in the first memory chip.

2. The method according to claim 1, wherein a command signal is generated by the controller and driven to the first one of the memory chips, and the first memory chip is set to have the first rank address in response to the command signal.

3. The method according to claim 2, wherein each step of the method is performed in a low speed mode for configuring each of the memory chips prior to a normal user mode.

4. The method according to claim 1, wherein the memory chips are arranged along byte lanes, and wherein the first memory chip drives the second rank address towards the second memory chip along the same byte lane, by which both memory chips are connected.

5. The method according to claim 4, wherein at least four memory chips are arranged along the same byte lane, and generating a second rank address, driving the second rank address to a next memory chip, and setting the next memory chip are repeated for the third and fourth memory chip.

6. The method according to claim 4, wherein the byte lane includes a set of data lines, and the rank address is driven from one of the memory chips to a next one of the memory chips via at least a subset of the data lines of the byte lane.

7. The method according to claim 2, wherein the command signal generated by the memory controller is driven to the first memory chip via at least a subset of command address lines of a command address bus.

8. The method according to claim 2, wherein the command signal generated by the memory controller is driven to the first memory chip via a serial management bus.

9. The method according to claim 8, wherein the command signal driven to the first memory chip via the serial management bus includes a reset command, the first memory chip being arranged:
   (a) to set the initial first rank address;
   (b) to generate the second rank address therefrom; and
   (c) to drive the second rank address to the second memory chip in response to the reset command, wherein steps (a)-(c) are based on a protocol based algorithm stored in the first memory chip.

10. The method according to claim 1, wherein the second memory chip is further arranged:
   (d) to be set to have the second rank address;
   (e) to generate a third rank address therefrom; and
   (f) to drive the third rank address to a third memory chip, wherein steps (d)-(f) are based on a protocol based algorithm stored in the second memory chip.

11. The method according to claim 9, wherein the second memory chip is further arranged:
   (d) to be set to have the second rank address;
   (e) to generate a third rank address therefrom; and
   (f) to drive the third rank address to a third memory chip, wherein steps (d)-(f) are based on a protocol based algorithm stored in the second memory chip.

12. The method according to claim 9, further comprising:
   terminating the command signal, which is a reset command, after a predetermined duration of time.

13. The method according to claim 10, further comprising:
   terminating the command signal, which is a reset command, in response to a signal sent back from a last one of the memory chips arranged along data lines of the same byte lane.

14. The method according to claim 11, further comprising the step of terminating the command signal, which is a reset command, in response to a signal sent back from a last one of the memory chips arranged along data lines of the same byte lane.

15. The method according to claim 8, wherein the command signal driven to the first memory chip via the serial management bus includes a protocol based sequence the serial commands for
   (a) setting the initial first rank address;
   (b) generating the second rank address therefrom; and
   (c) driving the second rank address to the second memory chip.

16. A semiconductor memory system, comprising:
   a memory controller; and
   at least one memory module having a number of memory chips arranged in terms of ranks,
   wherein the semiconductor memory system performs a power-up sequence of the memory module and of each of the memory chips after a system start or restart and wherein at least one of the memory chips is arranged to perform
   (a) setting a first one of the memory chips to an initial first rank address;
   (b) generating the second rank address therefrom; and
   (c) driving the second rank address to a second one of the memory chips
   in response to the power-up sequence wherein steps (a)-(c) are based on a protocol based algorithm stored in the at least one memory chip.

17. The semiconductor memory system according to claim 16, wherein the first one of the memory chips is connected to the memory controller by a serial management bus, and wherein the first one of the memory chips is arranged to perform the steps (a)-(b) in response to a pre-determined command signal issued by the memory controller.

18. A method for setting an address of a rank in a memory module, the memory module being controlled by a memory controller or a chip set, the memory module including a number of memory chips, the method comprising:
   setting a first one of the memory chips to have a first rank address;
   driving the first rank address to a second one of the memory chips, generating a second rank address from the first rank address in the second memory chip; and setting the second memory chip to have the second rank address in response to driving the second rank address due to the first memory chip, wherein a power-up sequence of the memory module and each of the memory chips is performed after a system start or restart, the first memory chip being arranged:

(a) to set the initial first rank address; and (b) to drive the first rank address to the second memory chip:

in response to the power-up sequence, wherein steps (a)-(b) are based on a protocol based algorithm stored in the first memory chip.

19. The method according to claim 18, wherein a command signal is generated by the controller, and then driven to the first one of the memory chips, and the first memory chip is set to have the first rank address in response to the command signal.

20. The method according to claim 18, wherein the memory chips are arranged along byte lanes, and wherein the first memory chip drives the first rank address towards the second memory chip along the same byte lane, by which both memory chips are connected.

21. The method according to claim 20, wherein at least four memory chips are arranged along the same byte lane, and driving a current rank address to a next memory chip, generating a next rank address in the next memory chip, and setting the next memory chip to have that generated next rank address are repeated for the third and fourth memory chip.

22. The method according to claim 20, wherein the byte lane includes a set of data lines, and the rank address is driven from one of the memory chips to a next one of the memory chips via at least a subset of the data lines of the byte lane.

23. The method according to claim 19, wherein the command signal generated by the memory controller is driven to the first memory chip via at least a subset of command address lines of a command address bus.

24. The method according to claim 19, wherein the command signal generated by the memory controller is driven to the first memory chip via a serial management bus.

25. The method according to claim 24, wherein the command signal driven to the first memory chip via the serial management bus includes a reset command, the first memory chip being arranged:

(a) to set the initial first rank address;

(b) to drive the first rank address to the second memory chip in response to the reset command, wherein steps (a) and (b) are based on a protocol based algorithm stored in the first memory chip.

26. The method according to claim 18, wherein the second memory chip is further arranged:

(c) to generate the second rank address from the first rank address;

(d) to be set to have the second rank address;

(e) to drive the second rank address to a third memory chip, wherein steps (c)-(e) are based on a protocol based algorithm stored in the first second chip.

27. The method according to claim 25, wherein the second memory chip is further arranged:

(c) to generate the second rank address from the first rank address;

(d) to be set to have the second rank address;

(e) to drive the second rank address to a third memory chip, wherein steps (c)-(e) are based on a protocol based algorithm stored in the first second chip.

28. The method according to claim 25, further comprising:

terminating the command signal, which is a reset command, after a predetermined duration of time.

29. The method according to claim 26, further comprising:

terminating the command signal, which is a reset command, in response to a signal sent back from a last one of the memory chips arranged along data lines of the same byte lane.

30. The method according to claim 29, further comprising:

terminating the command signal, which is a reset command, in response to a signal sent back from a last one of the memory chips arranged along data lines of the same byte lane.

31. The method according to claim 24, wherein the command signal driven to the first memory chip via the serial management bus includes a protocol based sequence of serial commands, the serial commands for (a) setting the initial first rank address; and (b) driving the first rank address to the second memory chip.

32. The method according to claim 19, wherein each step of the method is performed in a low speed mode for configuring each of the memory chips prior to a normal user mode.

33. A semiconductor memory system, comprising:

a memory controller; and at least one memory module having a number of memory chips arranged in terms of ranks, wherein the semiconductor memory system performs a power-up sequence of the memory module and of each of the memory chips after a system start or restart and wherein at least one of the memory chips is arranged to perform (a) setting a first one of the memory chips to an initial first rank address; and (b) driving the initial first rank address to a second one of the memory chips, the second one of the memory chips being responsive to a second rank address different from the first rank address in response to the power-up sequence wherein steps (a)-(b) are based on a protocol based algorithm stored in the at least one memory chip.

34. The semiconductor memory system according to claim 33 wherein the first one of the memory chips is connected to the memory controller by a serial management bus, and wherein the first one of the memory chips is arranged to perform the steps (a)-(b) in response to a pre-determined command signal issued by the memory controller.

35. The semiconductor memory system according to claim 33, wherein further memory chips are arranged along a same byte lane together with the first one of the memory chips, and wherein the second and any further memory chip along that byte lane is arranged to receive a rank address from a preceding and neighboring memory chip via data lines of the byte lane to generate a further rank address, to set its rank to that address and to drive the further rank address to another memory chip that is next to the second or further memory chip along the byte lane.

36. The semiconductor memory system according to claim 33, wherein further memory chips are arranged along a same byte lane together with the first one of the memory chips, and wherein the second and any further memory chip along that byte lane is arranged to receive a rank address from a preceding and neighboring memory chip via data lines of the byte lane, to set its rank to that address, to generate a further rank address and to drive the further rank address to another memory chip that is next to the second or further memory chip along the byte lane.

37. The semiconductor memory system according to claim 35, wherein further memory chips are arranged along a same byte lane together with the first one and second one of the memory chips, and wherein the second one of the memory chips and any further memory chip along that byte lane is arranged to receive a rank address from a preceding and neighboring memory chip via data lines of the byte lane to generate a further rank address, to set its rank to that address and to drive the further rank address to another memory chip that is next to the second one of the memory chips or further memory chip along the byte lane.

38. The semiconductor memory system according to claim 36, wherein further memory chips are arranged along a same byte lane together with the first one and the second one of the memory chips, and wherein the second one of the memory chips and any further memory chip along that byte lane is arranged to receive a rank address from a preceding and neighboring memory chip via data lines of the byte lane, to set its rank to that address, to generate a further rank address and to drive the further rank address to another memory chip that is next to the second one of the memory chips or further memory chip along the byte lane.

* * * * *